United States Patent
Bohannon et al.

(10) Patent No.: US 10,061,415 B2
(45) Date of Patent: Aug. 28, 2018

(54) INPUT DEVICE RECEIVER WITH DELTA-SIGMA MODULATOR

(71) Applicant: SYNAPTICS INCORPORATED, San Jose, CA (US)

(72) Inventors: Eric Scott Bohannon, Henrietta, NY (US); Marshall J. Bell, Jr., Dripping Springs, TX (US); Yihong Yang, Lubbock, TX (US)

(73) Assignee: SYNAPTICS INCORPORATED, San Jose, CA (US)

( * ) Notice: Subject to any disclaimer, the term of this patent is extended or adjusted under 35 U.S.C. 154(b) by 0 days.

(21) Appl. No.: 15/199,276

(22) Filed: Jun. 30, 2016

(65) Prior Publication Data

US 2018/0004317 A1 Jan. 4, 2018

(51) Int. Cl.
- *G06F 3/044* (2006.01)
- *G06F 3/041* (2006.01)
- *G06F 3/0354* (2013.01)

(52) U.S. Cl.
CPC ............. *G06F 3/041* (2013.01); *G06F 3/044* (2013.01); *G06F 3/03547* (2013.01); *G06F 3/0412* (2013.01); *G06F 3/0416* (2013.01); *G06F 3/0418* (2013.01)

(58) Field of Classification Search
None
See application file for complete search history.

(56) References Cited

U.S. PATENT DOCUMENTS

| | | | |
|---|---|---|---|
| 7,953,258 B2 | 5/2011 | Dean et al. | |
| 8,031,094 B2 | 10/2011 | Hotelling et al. | |
| 8,049,732 B2 | 11/2011 | Hotelling et al. | |
| 8,089,289 B1 | 1/2012 | Kremin et al. | |
| 8,344,921 B2 | 1/2013 | Lin et al. | |
| 8,681,029 B1 | 3/2014 | Wang et al. | |
| 8,878,797 B2 | 11/2014 | Erdogan et al. | |
| 9,151,792 B1 * | 10/2015 | Kremin | G01R 27/2605 |
| 9,166,621 B2 | 10/2015 | Kremin | |

(Continued)

FOREIGN PATENT DOCUMENTS

WO    WO-2009030580 A1    3/2009

OTHER PUBLICATIONS

International Search Report and Written Opinion for International Application No. PCT/US2017/031510 dated Aug. 16, 2017, consists of 10 pages.

*Primary Examiner* — Patrick Moon
(74) *Attorney, Agent, or Firm* — Patterson + Sheridan, LLP

(57) ABSTRACT

A processing system, and associated input device and method are disclosed suitable for reducing a receiver size within the input device. The processing system comprises a delta-sigma modulator comprising one or more input nodes configured to receive a signal based on a sensor signal received from at least a first sensor electrode of the plurality of sensor electrodes. The delta-sigma modulator further comprises an integrator coupled with the one or more input nodes and configured to produce an integration signal, a quantizer coupled with an output of the integrator and configured to quantize the integration signal, and a feedback digital-to-analog converter (DAC) controlled based by the quantizer. The processing system further comprises a digital filter coupled with an output of the delta-sigma modulator and configured to mitigate a quantization noise of the quantizer.

20 Claims, 6 Drawing Sheets

(56) References Cited

U.S. PATENT DOCUMENTS

| | | |
|---|---|---|
| 9,244,581 B2 | 1/2016 | Morein et al. |
| 9,383,395 B1* | 7/2016 | Ogirko ............... G01R 27/2605 |
| 2008/0116904 A1 | 5/2008 | Reynolds et al. |
| 2010/0073208 A1* | 3/2010 | Karthaus ............... H03M 3/382 |
| | | 341/120 |
| 2011/0025629 A1* | 2/2011 | Grivna ................. G06F 3/0416 |
| | | 345/173 |
| 2011/0242048 A1 | 10/2011 | Guedon et al. |
| 2015/0084797 A1 | 3/2015 | Singh et al. |
| 2015/0109157 A1 | 4/2015 | Caldwell et al. |
| 2015/0268760 A1* | 9/2015 | Park ........................ G06F 3/044 |
| | | 345/174 |
| 2015/0280733 A1 | 10/2015 | Aboushady et al. |
| 2016/0018867 A1 | 1/2016 | Nys et al. |
| 2016/0126972 A1 | 5/2016 | Chang |
| 2016/0149585 A1 | 5/2016 | Watanabe |

* cited by examiner

INPUT DEVICE RECEIVER WITH DELTA-SIGMA MODULATOR

BACKGROUND

Field

Embodiments of the present invention generally relate to techniques for operating an input device having a display device with an integrated sensing device.

Description of the Related Art

Input devices including proximity sensor devices (also commonly called touchpads or touch sensor devices) are widely used in a variety of electronic systems. A proximity sensor device typically includes a sensing region, often demarked by a surface, in which the proximity sensor device determines the presence, location and/or motion of one or more input objects. Proximity sensor devices may be used to provide interfaces for the electronic system. For example, proximity sensor devices are often used as input devices for larger computing systems (such as opaque touchpads integrated in, or peripheral to, notebook or desktop computers). Proximity sensor devices are also often used in smaller computing systems (such as touch screens integrated in cellular phones).

SUMMARY

One embodiment described herein is a processing system for an input device comprising a plurality of sensor electrodes. The processing system comprises a delta-sigma modulator comprising one or more input nodes configured to receive a signal based on a sensor signal received from at least a first sensor electrode of the plurality of sensor electrodes, and an integrator coupled with the one or more input nodes and configured to produce an integration signal. The delta-sigma modulator further comprises a quantizer coupled with an output of the integrator and configured to quantize the integration signal and a feedback digital-to-analog converter (DAC) controlled based by the quantizer. The processing system further comprises a digital filter coupled with an output of the delta-sigma modulator and configured to mitigate a quantization noise of the quantizer.

Another embodiment described herein is an input device, comprising a plurality of sensor electrodes, and a processing system coupled with the plurality of sensor electrodes. The processing system comprises a delta-sigma modulator comprising one or more input nodes configured to receive a signal based on a sensor signal received from at first sensor electrode of the plurality of sensor electrodes. The delta-sigma modulator further comprises an integrator coupled with the one or more input nodes and configured to produce an integration signal, a quantizer coupled with an output of the integrator and configured to quantize the integration signal, and a feedback digital-to-analog converter (DAC) controlled based by the quantizer. The processing system further comprises a digital filter coupled with an output of the delta-sigma modulator and configured to mitigate a quantization noise of the quantizer.

Another embodiment described herein is a method comprising receiving, at one or more input nodes, a sensor signal from a first sensor electrode of a plurality of sensor electrodes. The method further comprises integrating a signal based on the sensor signal to produce an integration signal, and quantizing the integration signal. The method further comprises controlling a feedback digital-to-analog converter (DAC) based on the quantization of the integration signal, the feedback DAC coupled with the one or more input nodes. The method further comprises mitigating a quantization noise using a digital filter.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

Figure 1:
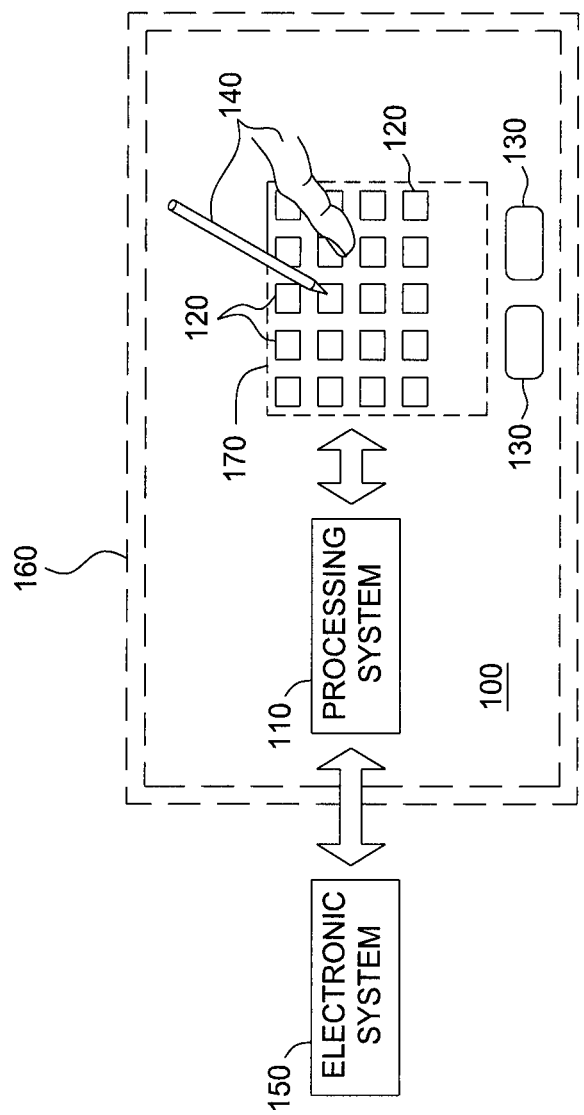
FIG. 1 is a schematic block diagram of an input device, according to one embodiment.

To facilitate understanding, identical reference numerals have been used, where possible, to designate identical elements that are common to the figures. It is contemplated that elements disclosed in one embodiment may be beneficially utilized on other embodiments without specific recitation. The drawings referred to here should not be understood as being drawn to scale unless specifically noted. Also, the drawings are often simplified and details or components omitted for clarity of presentation and explanation. The drawings and discussion serve to explain principles discussed below, where like designations denote like elements.

DETAILED DESCRIPTION

The following detailed description is merely exemplary in nature and is not intended to limit the disclosure or the application and uses of the disclosure. Furthermore, there is no intention to be bound by any expressed or implied theory presented in the preceding background, summary, or in the following detailed description.

As input devices become more complex and include increasing numbers of sensor electrodes, the processing demands on the processing system are similarly increased. To suitably process the input signals received from the sensor electrodes within other system constraints, the processing system tends to require at least one of (1) more area for additional processing circuitry for the sensor electrodes, (2) reduced-size processing circuitry for a given area, and (3) more time for processing the received input signals. However, as input device functionality continues to increase within the same (or smaller) packaging, increasing the area allotted for processing circuitry in some cases is not feasible. Moreover, providing more area for additional processing circuitry may increase production costs. Further, for input devices having integrated display devices, higher resolution displays tend to require more time for display updating. As a result, in some cases, allotting more time for processing received input signals from sensor electrodes is not feasible.

Embodiments described herein generally include a processing system and associated input device and method for processing signals received from a sensor electrode. More specifically, the processing system comprises a delta-sigma modulator comprising an integrator, quantizer, feedback digital-to-analog converter (DAC) and common-mode feedback arrangement. In some embodiments, the delta-sigma modulator is included within an analog front-end (AFE) or other receiver circuitry of the processing system. In some embodiments, the delta-sigma modulator comprises a differential first-order continuous time passive delta-sigma modulator. Collectively, the components of the delta-sigma modulator result in an AFE having a significantly smaller size than conventional AFEs.

Exemplary Input Device Implementations

FIG. 1 is a schematic block diagram of an input device 100, in accordance with embodiments of the present technology. In various embodiments, input device 100 comprises a display device integrated with a sensing device. The input device 100 may be configured to provide input to an electronic system 150. As used in this document, the term "electronic system" (or "electronic device") broadly refers to any system capable of electronically processing information. Some non-limiting examples of electronic systems include personal computers of all sizes and shapes, such as desktop computers, laptop computers, netbook computers, tablets, web browsers, e-book readers, and personal digital assistants (PDAs). Additional example electronic systems include composite input devices, such as physical keyboards that include input device 100 and separate joysticks or key switches. Further example electronic systems include peripherals such as data input devices (including remote controls and mice), and data output devices (including display screens and printers). Other examples include remote terminals, kiosks, and video game machines (e.g., video game consoles, portable gaming devices, and the like). Other examples include communication devices (including cellular phones, such as smart phones), and media devices (including recorders, editors, and players such as televisions, set-top boxes, music players, digital photo frames, and digital cameras). Additionally, the electronic system could be a host or a slave to the input device.

The input device 100 can be implemented as a physical part of the electronic system, or can be physically separate from the electronic system. As appropriate, the input device 100 may communicate with parts of the electronic system using any one or more of the following: buses, networks, and other wired or wireless interconnections. Examples include I²C, SPI, PS/2, Universal Serial Bus (USB), Bluetooth, RF, and IRDA.

In FIG. 1, the input device 100 is shown as a proximity sensor device (also often referred to as a "touchpad" or a "touch sensor device") configured to sense input provided by one or more input objects 140 in a sensing region 170. Example input objects include fingers and styli, as shown in FIG. 1.

Sensing region 170 encompasses any space above, around, in and/or near the input device 100 in which the input device 100 is able to detect user input (e.g., user input provided by one or more input objects 140). The sizes, shapes, and locations of particular sensing regions may vary widely from embodiment to embodiment. In some embodiments, the sensing region 170 extends from a surface of the input device 100 in one or more directions into space until signal-to-noise ratios prevent sufficiently accurate object detection. The distance to which this sensing region 170 extends in a particular direction, in various embodiments, may be on the order of less than a millimeter, millimeters, centimeters, or more, and may vary significantly with the type of sensing technology used and the accuracy desired. Thus, some embodiments sense input that comprises no contact with any surfaces of the input device 100, contact with an input surface (e.g. a touch surface) of the input device 100, contact with an input surface of the input device 100 coupled with some amount of applied force or pressure, and/or a combination thereof. In various embodiments, input surfaces may be provided by surfaces of casings within which the sensor electrodes reside, by face sheets applied over the sensor electrodes or any casings, etc. In some embodiments, the sensing region 170 has a rectangular shape when projected onto an input surface of the input device 100.

The input device 100 may utilize any combination of sensor components and sensing technologies to detect user input in the sensing region 170. The input device 100 comprises a plurality of sensor electrodes 120 for detecting user input. The input device 100 may include one or more sensor electrodes 120 that are combined to form sensor electrodes. As several non-limiting examples, the input device 100 may use capacitive, elastive, resistive, inductive, magnetic acoustic, ultrasonic, and/or optical techniques.

Some implementations are configured to provide images that span one, two, three, or higher dimensional spaces. Some implementations are configured to provide projections of input along particular axes or planes.

In some resistive implementations of the input device 100, a flexible and conductive first layer is separated by one or more spacer elements from a conductive second layer. During operation, one or more voltage gradients are created across the layers. Pressing the flexible first layer may deflect it sufficiently to create electrical contact between the layers, resulting in voltage outputs reflective of the point(s) of contact between the layers. These voltage outputs may be used to determine positional information.

In some inductive implementations of the input device 100, one or more sensor electrodes 120 pickup loop currents induced by a resonating coil or pair of coils. Some combination of the magnitude, phase, and frequency of the currents may then be used to determine positional information.

In some capacitive implementations of the input device 100, voltage or current is applied to create an electric field. Nearby input objects cause changes in the electric field, and produce detectable changes in capacitive coupling that may be detected as changes in voltage, current, or the like.

Some capacitive implementations utilize arrays or other regular or irregular patterns of capacitive sensor electrodes 120 to create electric fields. In some capacitive implementations, separate sensor electrodes 120 may be ohmically shorted together to form larger sensor electrodes. Some capacitive implementations utilize resistive sheets, which may be uniformly resistive.

As discussed above, some capacitive implementations utilize "self-capacitance" (or "absolute capacitance") sensing methods based on changes in the capacitive coupling between sensor electrodes 120 and an input object. In one embodiment, processing system 110 is configured to drive a voltage with known amplitude onto the sensor electrode 120 and measure the amount of charge required to charge the sensor electrode to the driven voltage. In other embodiments, processing system 110 is configured to drive a known current and measure the resulting voltage. In various embodiments, an input object near the sensor electrodes 120 alters the electric field near the sensor electrodes 120, thus changing the measured capacitive coupling. In one implementation, an absolute capacitance sensing method operates by modulating sensor electrodes 120 with respect to a reference voltage (e.g. system ground) using a modulated signal, and by detecting the capacitive coupling between the sensor electrodes 120 and input objects 140.

Additionally as discussed above, some capacitive implementations utilize "mutual capacitance" (or "transcapacitance") sensing methods based on changes in the capacitive coupling between sensing electrodes. In various embodiments, an input object 140 near the sensing electrodes alters the electric field between the sensing electrodes, thus changing the measured capacitive coupling. In one implementation, a transcapacitive sensing method operates by detecting the capacitive coupling between one or more transmitter sensing electrodes (also "transmitter electrodes") and one or more receiver sensing electrodes (also "receiver electrodes") as further described below. Transmitter sensing electrodes may be modulated relative to a reference voltage (e.g., system ground) to transmit a transmitter signals. Receiver sensing electrodes may be held substantially constant relative to the reference voltage to facilitate receipt of resulting signals. A resulting signal may comprise effect(s) corresponding to one or more transmitter signals, and/or to one or more sources of environmental interference (e.g. other electromagnetic signals). Sensing electrodes may be dedicated transmitter electrodes or receiver electrodes, or may be configured to both transmit and receive.

In FIG. 1, the processing system 110 is shown as part of the input device 100. The processing system 110 is configured to operate the hardware of the input device 100 to detect input in the sensing region 170. The processing system 110 comprises parts of or all of one or more integrated circuits (ICs) and/or other circuitry components. For example, a processing system for a mutual capacitance sensor device may comprise transmitter circuitry configured to transmit signals with transmitter sensor electrodes, and/or receiver circuitry configured to receive signals with receiver sensor electrodes. In some embodiments, the processing system 110 also comprises electronically-readable instructions, such as firmware code, software code, and/or the like. In some embodiments, components composing the processing system 110 are located together, such as near sensor electrode(s) 120 of the input device 100. In other embodiments, components of processing system 110 are physically separate with one or more components close to sensor electrode(s) 120 of input device 100, and one or more components elsewhere. For example, the input device 100 may be a peripheral coupled to a desktop computer, and the processing system 110 may comprise software configured to run on a central processing unit of the desktop computer and one or more ICs (perhaps with associated firmware) separate from the central processing unit. As another example, the input device 100 may be physically integrated in a phone, and the processing system 110 may comprise circuits and firmware that are part of a main processor of the phone. In some embodiments, the processing system 110 is dedicated to implementing the input device 100. In other embodiments, the processing system 110 also performs other functions, such as operating display screens, driving haptic actuators, etc.

The processing system 110 may be implemented as a set of modules that handle different functions of the processing system 110. Each module may comprise circuitry that is a part of the processing system 110, firmware, software, or a combination thereof. In various embodiments, different combinations of modules may be used. Example modules include hardware operation modules for operating hardware such as sensor electrodes and display screens, data processing modules for processing data such as sensor signals and positional information, and reporting modules for reporting information. Further example modules include sensor operation modules configured to operate sensor electrodes 120 to detect input, identification modules configured to identify gestures such as mode changing gestures, and mode changing modules for changing operation modes. Processing system 110 may also comprise one or more controllers.

In some embodiments, the processing system 110 responds to user input (or lack of user input) in the sensing region 170 directly by causing one or more actions. Example actions include changing operation modes, as well as GUI actions such as cursor movement, selection, menu navigation, and other functions. In some embodiments, the processing system 110 provides information about the input (or lack of input) to some part of the electronic system (e.g. to a central processing system of the electronic system that is separate from the processing system 110, if such a separate central processing system exists). In some embodiments, some part of the electronic system processes information received from the processing system 110 to act on user input, such as to facilitate a full range of actions, including mode changing actions and GUI actions.

For example, in some embodiments, the processing system 110 operates the sensor electrode(s) 120 of the input device 100 to produce electrical signals indicative of input (or lack of input) in the sensing region 170. The processing system 110 may perform any appropriate amount of processing on the electrical signals in producing the information provided to the electronic system. For example, the processing system 110 may digitize analog electrical signals obtained from the sensor electrodes 120. As another example, the processing system 110 may perform filtering or other signal conditioning. As yet another example, the processing system 110 may subtract or otherwise account for a baseline, such that the information reflects a difference between the electrical signals and the baseline. As yet further examples, the processing system 110 may determine positional information, recognize inputs as commands, recognize handwriting, and the like.

"Positional information" as used herein broadly encompasses absolute position, relative position, velocity, acceleration, and other types of spatial information. Exemplary "zero-dimensional" positional information includes near/far or contact/no contact information. Exemplary "one-dimensional" positional information includes positions along an axis. Exemplary "two-dimensional" positional information includes motions in a plane. Exemplary "three-dimensional" positional information includes instantaneous or average velocities in space. Further examples include other representations of spatial information. Historical data regarding one or more types of positional information may also be determined and/or stored, including, for example, historical data that tracks position, motion, or instantaneous velocity over time.

In some embodiments, the input device 100 is implemented with additional input components that are operated by the processing system 110 or by some other processing system. These additional input components may provide redundant functionality for input in the sensing region 170, or some other functionality. FIG. 1 shows buttons 130 near the sensing region 170 that can be used to facilitate selection of items using the input device 100. Other types of additional input components include sliders, balls, wheels, switches, and the like. Conversely, in some embodiments, the input device 100 may be implemented with no other input components.

In some embodiments, the input device 100 comprises a touch screen interface, and the sensing region 170 overlaps at least part of an active area of a display screen of the display device 160. For example, the input device 100 may comprise substantially transparent sensor electrodes 120 overlaying the display screen and provide a touch screen interface for the associated electronic system. The display screen may be any type of dynamic display capable of displaying a visual interface to a user, and may include any type of light emitting diode (LED), organic LED (OLED), cathode ray tube (CRT), liquid crystal display (LCD), plasma, electroluminescence (EL), or other display technology. The input device 100 and the display device 160 may share physical elements. For example, some embodiments may utilize some of the same electrical components for displaying and sensing. As another example, the display device 160 may be operated in part or in total by the processing system 110.

It should be understood that while many embodiments of the present technology are described in the context of a fully functioning apparatus, the mechanisms of the present technology are capable of being distributed as a program product (e.g., software) in a variety of forms. For example, the mechanisms of the present technology may be implemented and distributed as a software program on information bearing media that are readable by electronic processors (e.g., non-transitory computer-readable and/or recordable/writable information bearing media readable by the processing system 110). Additionally, the embodiments of the present technology apply equally regardless of the particular type of medium used to carry out the distribution. Examples of non-transitory, electronically readable media include various discs, memory sticks, memory cards, memory modules, and the like. Electronically readable media may be based on flash, optical, magnetic, holographic, or any other storage technology.

Exemplary Sensor Electrode Arrangements

Figure 2:
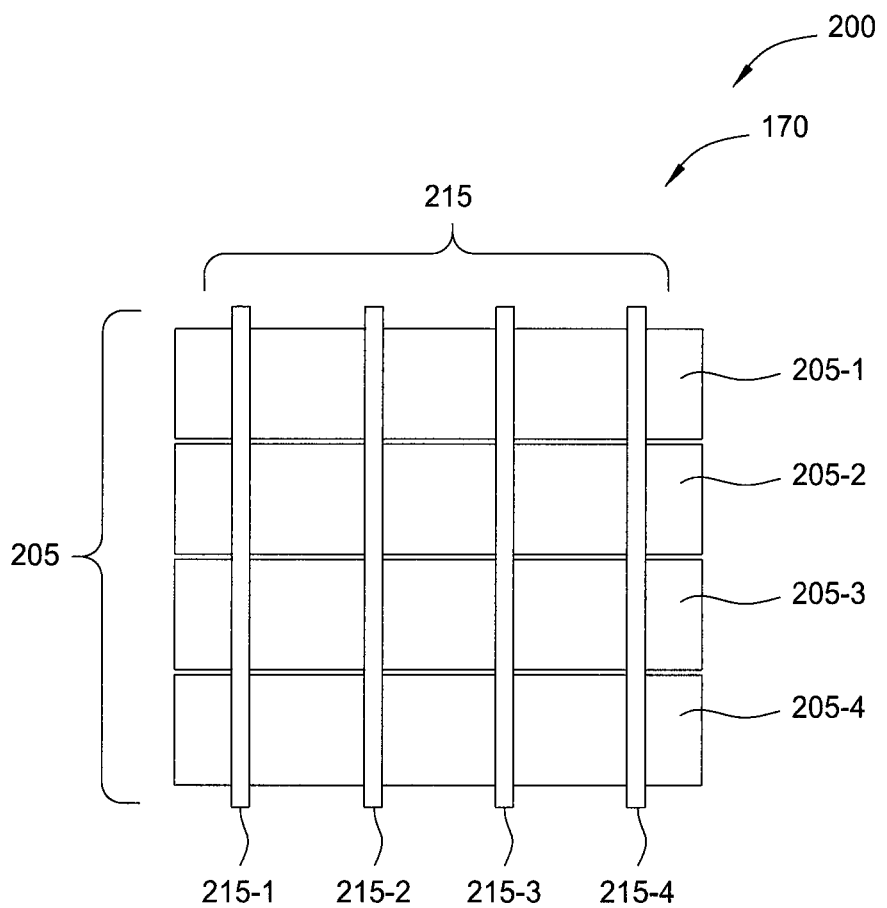
FIGS. 2 and 3 illustrate portions of exemplary sensor electrode arrangements, according to one embodiment.
Figure 3:
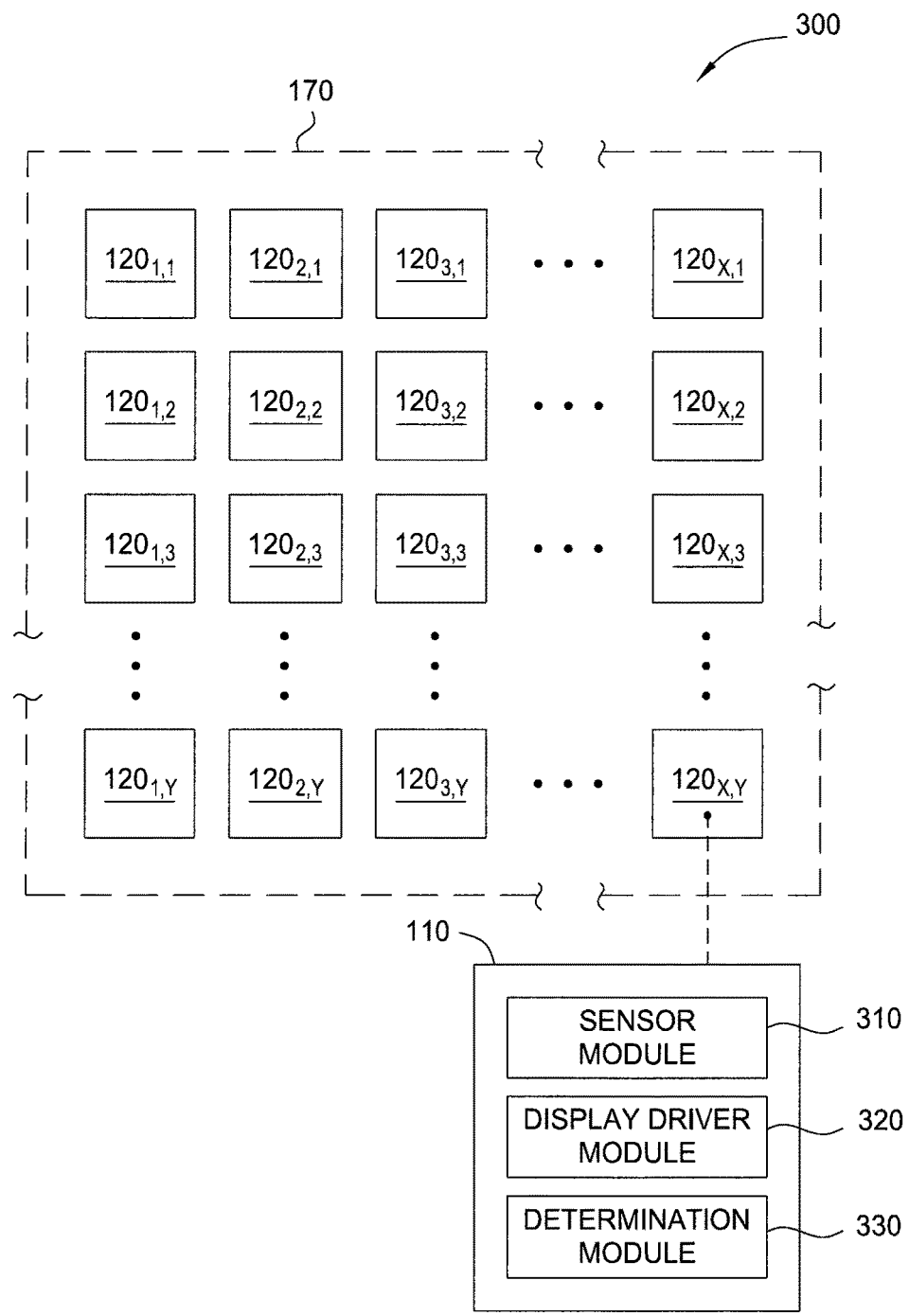

FIGS. 2 and 3 illustrate portions of exemplary sensor electrode arrangements, according to embodiments described herein. Specifically, arrangement 200 (FIG. 2) illustrates a portion of a pattern of sensor electrodes configured to sense in a sensing region 170 associated with the pattern, according to several embodiments. For clarity of illustration and description, FIG. 2 shows the sensor electrodes in a pattern of simple rectangles, and does not show various associated components. This pattern of sensing electrodes comprises a first plurality of sensor electrodes 205 (e.g., 205-1, 205-2, 205-3, 205-4), and a second plurality of sensor electrodes 215 (e.g., 215-1, 215-2, 215-3, 215-4). The sensor electrodes 205, 215 are each examples of the sensor electrodes 120 discussed above. In one embodiment, processing system 110 operates the first plurality of sensor electrodes 205 as a plurality of transmitter electrodes, and the second plurality of sensor electrodes 215 as a plurality of receiver electrodes. In another embodiment, processing system 110 operates the first plurality of sensor electrodes 205 and the second plurality of sensor electrodes 215 as absolute capacitive sensing electrodes.

The first plurality of sensor electrodes 205 and the second plurality of sensor electrodes 215 are typically ohmically isolated from each other. That is, one or more insulators separate the first plurality of sensor electrodes 205 and the second plurality of sensor electrodes 215 and prevent them from electrically shorting to each other. In some embodiments, the first plurality of sensor electrodes 205 and the second plurality of sensor electrodes 215 may be disposed on a common layer. The pluralities of sensor electrodes 205, 215 may be electrically separated by insulative material disposed between them at cross-over areas; in such constructions, the first plurality of sensor electrodes 205 and/or the second plurality of sensor electrodes 215 may be formed with jumpers connecting different portions of the same electrode. In some embodiments, the first plurality of sensor electrodes 205 and the second plurality of sensor electrodes 215 are separated by one or more layers of insulative material. In some embodiments, the first plurality of sensor electrodes 205 and the second plurality of sensor electrodes 215 are separated by one or more substrates; for example, they may be disposed on opposite sides of the same substrate, or on different substrates that are laminated together.

The pluralities of sensor electrodes 205, 215 may be formed into any desired shapes. Moreover, the size and/or shape of the sensor electrodes 205 may be different than the size and/or shape of the sensor electrodes 215. Additionally, sensor electrodes 205, 215 located on a same side of a substrate, may have different shapes and/or sizes. In one embodiment, the first plurality of sensor electrodes 205 may be larger (e.g., having a larger surface area) than the second plurality of sensor electrodes 215, although this is not a requirement. In other embodiments, the first and second pluralities of sensor electrodes 205, 215 may have a similar size and/or shape.

In one embodiment, the first plurality of sensor electrodes 205 extends substantially in a first direction while the second plurality of sensor electrodes 215 extends substantially in a second direction. For example, and as shown in FIG. 2, the first plurality of sensor electrodes 205 extend in one direction, while the second plurality of sensor electrodes 215 extend in a direction substantially orthogonal to the sensor electrodes 205. Other orientations are also possible (e.g., parallel or other relative orientations).

In some embodiments, both the first and second pluralities of sensor electrodes 205, 215 are located outside of a plurality (or display stack) of layers that together form the display device 160. One example of a display stack may include layers such as a lens layer, a one or more polarizer layers, a color filter layer, one or more display electrodes layers, a display material layer, a thin-film transistor (TFT) glass layer, and a backlight layer. However, other arrangements of a display stack are possible. In other embodiments, one or both of the first and second pluralities of sensor electrodes 205, 215 are located within the display stack, whether included as part of a display-related layer or a separate layer. For example, Vcom electrodes within a particular display electrode layer can be configured to perform both display updating and capacitive sensing.

Arrangement 300 of FIG. 3 illustrates a portion of a pattern of sensor electrodes configured to sense in sensing region 170, according to several embodiments. For clarity of illustration and description, FIG. 3 shows the sensor electrodes 120 in a pattern of simple rectangles and does not show other associated components. The exemplary pattern comprises an array of sensor electrodes $120_{X,Y}$ arranged in X columns and Y rows, wherein X and Y are positive integers, although one of X and Y may be zero. It is contemplated that the pattern of sensor electrodes 120 may have other configurations, such as polar arrays, repeating patterns, non-repeating patterns, a single row or column, or other suitable arrangement. Further, in various embodiments the number of sensor electrodes 120 may vary from row to row and/or column to column. In one embodiment, at least one row and/or column of sensor electrodes 120 is offset from the others, such it extends further in at least one direction than the others. The sensor electrodes 120 is coupled to the processing system 110 and utilized to determine the presence (or lack thereof) of an input object in the sensing region 170.

In a first mode of operation, the arrangement of sensor electrodes 120 ($120_{1,1}$, $120_{2,1}$, $120_{3,1}$, $120_{X,Y}$) may be utilized to detect the presence of an input object via absolute sensing techniques. That is, processing system 110 is configured to modulate sensor electrodes 120 to acquire measurements of changes in capacitive coupling between the modulated sensor electrodes 120 and an input object to determine the position of the input object. Processing system 110 is further configured to determine changes of absolute capacitance based on a measurement of resulting signals received with sensor electrodes 120 which are modulated.

In some embodiments, the arrangement 300 includes one or more grid electrodes (not shown) that are disposed between at least two of the sensor electrodes 120. The grid electrode(s) may at least partially circumscribe the plurality of sensor electrodes 120 as a group, and may also, or in the alternative, completely or partially circumscribe one or more of the sensor electrodes 120. In one embodiment, the grid electrode is a planar body having a plurality of apertures, where each aperture circumscribes a respective one of the sensor electrodes 120. In other embodiments, the grid electrode(s) comprise a plurality of segments that may be driven individually or in groups or two or more segments. The grid electrode(s) may be fabricated similar to the sensor electrodes 120. The grid electrode(s), along with sensor electrodes 120, may be coupled to the processing system 110 utilizing conductive routing traces and used for input object detection.

The sensor electrodes 120 are typically ohmically isolated from each other, and are also ohmically isolated from the grid electrode(s). That is, one or more insulators separate the sensor electrodes 120 and grid electrode(s) and prevent them from electrically shorting to each other. In some embodiments, the sensor electrodes 120 and grid electrode(s) are separated by an insulative gap, which may be filled with an electrically insulating material, or may be an air gap. In some embodiments, the sensor electrodes 120 and the grid electrode(s) are vertically separated by one or more layers of insulative material. In some other embodiments, the sensor electrodes 120 and the grid electrode(s) are separated by one or more substrates; for example, they may be disposed on opposite sides of the same substrate, or on different substrates. In yet other embodiments, the grid electrode(s) may be composed of multiple layers on the same substrate, or on different substrates. In one embodiment, a first grid electrode may be formed on a first substrate (or a first side of a substrate) and a second grid electrode may be formed on a second substrate (or a second side of a substrate). For example, a first grid electrode comprises one or more common electrodes disposed on a thin-film transistor (TFT) layer of the display device 160 (FIG. 1) and a second grid electrode is disposed on the color filter glass of the display device 160. The dimensions of the first and second grid electrodes can be equal or differ in at least one dimension.

In a second mode of operation, the sensor electrodes 120 ($120_{1,1}$, $120_{2,1}$, $120_{3,1}$, $120_{X,Y}$) may be utilized to detect the presence of an input object via transcapacitive sensing techniques when a transmitter signal is driven onto the grid electrode(s). That is, processing system 110 is configured to drive the grid electrode(s) with a transmitter signal and to receive resulting signals with each sensor electrode 120, where a resulting signal comprising effects corresponding to the transmitter signal, which is utilized by the processing system 110 or other processor to determine the position of the input object.

In a third mode of operation, the sensor electrodes 120 may be split into groups of transmitter and receiver electrodes utilized to detect the presence of an input object via transcapacitive sensing techniques. That is, processing system 110 may drive a first group of sensor electrodes 120 with a transmitter signal and receive resulting signals with the second group of sensor electrodes 120, where a resulting signal comprising effects corresponding to the transmitter signal. The resulting signal is utilized by the processing system 110 or other processor to determine the position of the input object.

The input device 100 may be configured to operate in any one of the modes described above. The input device 100 may also be configured to switch between any two or more of the modes described above.

The areas of localized capacitive sensing of capacitive couplings may be termed "capacitive pixels," "touch pixels," "tixels," etc. Capacitive pixels may be formed between an individual sensor electrode 120 and a reference voltage in the first mode of operation, between the sensor electrodes 120 and grid electrode(s) in the second mode of operation, and between groups of sensor electrodes 120 used as transmitter and receiver electrodes (e.g., arrangement 200 of FIG. 2). The capacitive coupling changes with the proximity and motion of input objects in the sensing region 170 associated with the sensor electrodes 120, and thus may be used as an indicator of the presence of the input object in the sensing region of the input device 100.

In some embodiments, the sensor electrodes 120 are "scanned" to determine these capacitive couplings. That is, in one embodiment, one or more of the sensor electrodes 120 are driven to transmit transmitter signals. Transmitters may be operated such that one transmitter electrode transmits at one time, or such that multiple transmitter electrodes transmit at the same time. Where multiple transmitter electrodes transmit simultaneously, the multiple transmitter electrodes may transmit the same transmitter signal and thereby produce an effectively larger transmitter electrode. Alternatively, the multiple transmitter electrodes may transmit different transmitter signals. For example, multiple transmitter electrodes may transmit different transmitter signals according to one or more coding schemes that enable their combined effects on the resulting signals of receiver electrodes to be independently determined. In one embodiment, multiple transmitter electrodes may simultaneously transmit the same transmitter signal while the receiver electrodes receive the effects and are measured according to a scanning scheme.

The sensor electrodes 120 configured as receiver sensor electrodes may be operated singly or multiply to acquire resulting signals. The resulting signals may be used to determine measurements of the capacitive couplings at the capacitive pixels. Processing system 110 may be configured to receive with the sensor electrodes 120 in a scanning fashion and/or a multiplexed fashion to reduce the number of simultaneous measurements to be made, as well as the size of the supporting electrical structures. In one embodiment, one or more sensor electrodes are coupled to a receiver of processing system 110 via a switching element such as a multiplexer or the like. In such an embodiment, the switching element may be internal to processing system 110 or external to processing system 110. In one or more embodiments, the switching elements may be further configured to couple a sensor electrode 120 with a transmitter or other signal and/or voltage potential. In one embodiment, the switching element may be configured to couple more than one receiver electrode to a common receiver at the same time.

In other embodiments, "scanning" sensor electrodes 120 to determine these capacitive couplings comprises modulating one or more of the sensor electrodes and measuring an absolute capacitance of the one or sensor electrodes. In another embodiment, the sensor electrodes may be operated such that more than one sensor electrode is driven and received with at a time. In such embodiments, an absolute capacitive measurement may be obtained from each of the one or more sensor electrodes 120 simultaneously. In one embodiment, each of the sensor electrodes 120 are simultaneously driven and received with, obtaining an absolute capacitive measurement simultaneously from each of the sensor electrodes 120. In various embodiments, processing system 110 may be configured to selectively modulate a portion of sensor electrodes 120. For example, the sensor electrodes may be selected based on, but not limited to, an application running on the host processor, a status of the input device, and an operating mode of the sensing device. In various embodiments, processing system 110 may be configured to selectively shield at least a portion of sensor electrodes 120 and to selectively shield or transmit with the grid electrode(s) 122 while selectively receiving and/or transmitting with other sensor electrodes 120.

A set of measurements from the capacitive pixels form a "capacitive image" (also "capacitive frame") representative of the capacitive couplings at the pixels. Multiple capacitive images may be acquired over multiple time periods, and differences between them used to derive information about input in the sensing region. For example, successive capacitive images acquired over successive periods of time can be used to track the motion(s) of one or more input objects entering, exiting, and within the sensing region.

In any of the above embodiments, multiple sensor electrodes 120 may be ganged together such that the sensor electrodes 120 are simultaneously modulated or simultaneously received with. As compared to the methods described above, ganging together multiple sensor electrodes may produce a coarse capacitive image that may not be usable to discern precise positional information. However, a coarse capacitive image may be used to sense presence of an input object. In one embodiment, the coarse capacitive image may be used to move processing system 110 or the input device 100 out of a "doze" mode or low-power mode. In one embodiment, the coarse capacitive image may be used to move a capacitive sensing IC out of a "doze" mode or low-power mode. In another embodiment, the coarse capacitive image may be used to move at least one of a host IC and a display driver out of a "doze" mode or low-power mode. The coarse capacitive image may correspond to the entire sensor area or only to a portion of the sensor area.

The background capacitance of the input device 100 is the capacitive image associated with no input object in the sensing region 170. The background capacitance changes with the environment and operating conditions, and may be estimated in various ways. For example, some embodiments take "baseline images" when no input object is determined to be in the sensing region 170, and use those baseline images as estimates of their background capacitances. The background capacitance or the baseline capacitance may be present due to stray capacitive coupling between two sensor electrodes, where one sensor electrode is driven with a modulated signal and the other is held stationary relative to system ground, or due to stray capacitive coupling between a receiver electrode and nearby modulated electrodes. In many embodiments, the background or baseline capacitance may be relatively stationary over the time period of a user input gesture.

Capacitive images can be adjusted for the background capacitance of the input device 100 for more efficient processing. Some embodiments accomplish this by "baselining" measurements of the capacitive couplings at the capacitive pixels to produce a "baselined capacitive image." That is, some embodiments compare the measurements forming a capacitance image with appropriate "baseline values" of a "baseline image" associated with those pixels, and determine changes from that baseline image.

In some touch screen embodiments, one or more of the sensor electrodes 120 comprise one or more display electrodes used in updating the display of the display screen. The display electrodes may comprise one or more elements of the active matrix display such as one or more segments of a segmented Vcom electrode (common electrode(s)), a source drive line, gate line, an anode sub-pixel electrode or cathode pixel electrode, or any other suitable display element. These display electrodes may be disposed on an appropriate display screen substrate. For example, the common electrodes may be disposed on the a transparent substrate (a glass substrate, TFT glass, or any other transparent material) in some display screens (e.g., In-Plane Switching (IPS), Fringe Field Switching (FFS) or Plane to Line Switching (PLS) Organic Light Emitting Diode (OLED)), on the bottom of the color filter glass of some display screens (e.g., Patterned Vertical Alignment (PVA) or Multi-domain Vertical Alignment (MVA)), over an emissive layer (OLED), etc. In such embodiments, the display electrode can also be referred to as a "combination electrode," since it performs multiple functions. In various embodiments, each of the sensor electrodes 120 comprises one or more common electrodes. In other embodiments, at least two sensor electrodes 120 may share at least one common electrode. While the following description may describe that sensor electrodes 120 and/or grid electrode(s) comprise one or more common electrodes, various other display electrodes as describe above may also be used in conjunction with the common electrode or as an alternative to the common electrodes. In various embodiments, the sensor electrodes 120 and grid electrode(s) comprise the entire common electrode layer (Vcom electrode).

In various touch screen embodiments, the "capacitive frame rate" (the rate at which successive capacitive images are acquired) may be the same or be different from that of the "display frame rate" (the rate at which the display image is updated, including refreshing the screen to redisplay the same image). In various embodiments, the capacitive frame rate is an integer multiple of the display frame rate. In other embodiments, the capacitive frame rate is a fractional multiple of the display frame rate. In yet further embodiments, the capacitive frame rate may be any fraction or integer multiple of the display frame rate. In one or more embodiments, the display frame rate may change (e.g., to reduce power or to provide additional image data such as a 3D display information) while touch frame rate maintains constant. In other embodiment, the display frame rate may remain constant while the touch frame rate is increased or decreased.

Continuing to refer to FIG. 3, the processing system 110 coupled to the sensor electrodes 120 includes a sensor module 310 and optionally, a display driver module 320. The sensor module 310 includes circuitry configured to drive at least one of the sensor electrodes 120 for capacitive sensing during periods in which input sensing is desired. In one embodiment, the sensor module 310 is configured to drive a modulated signal onto the at least one sensor electrode 120 to detect changes in absolute capacitance between the at least one sensor electrode and an input object. In another embodiment, the sensor module 310 is configured to drive a transmitter signal onto the at least one sensor electrode 120 to detect changes in a transcapacitance between the at least one sensor electrode and another sensor electrode 120. The modulated and transmitter signals are generally varying voltage signals comprising a plurality of voltage transitions over a period of time allocated for input sensing. In various embodiments, the sensor electrodes 120 and/or grid electrode(s) may be driven differently in different modes of operation. In one embodiment, the sensor electrodes 120 and/or grid electrode(s) may be driven with signals (modulated signals, transmitter signals and/or shield signals) that may differ in any one of phase, amplitude, and/or shape. In various embodiments, the modulated signal and transmitter signal are similar in at least one shape, frequency, amplitude, and/or phase. In other embodiments, the modulated signal and the transmitter signals are different in frequency, shape, phase, amplitude, and phase. The sensor module 310 may be selectively coupled one or more of the sensor electrodes 120 and/or the grid electrode(s). For example, the sensor module 310 may be coupled selected portions of the sensor electrodes 120 and operate in either an absolute or transcapacitive sensing mode. In another example, the sensor module 310 may be a different portion of the sensor electrodes 120 and operate in either an absolute or transcapacitive sensing mode. In yet another example, the sensor module 310 may be coupled to all the sensor electrodes 120 and operate in either an absolute or transcapacitive sensing mode.

The sensor module 310 is configured to operate the grid electrode(s) as a shield electrode that may shield sensor electrodes 120 from the electrical effects of nearby conductors. In one embodiment, the processing system is configured to operate the grid electrode(s) as a shield electrode that may "shield" sensor electrodes 120 from the electrical effects of nearby conductors, and to guard the sensor electrodes 120 from grid electrode(s), at least partially reducing the parasitic capacitance between the grid electrode(s) and the sensor electrodes 120. In one embodiment, a shielding signal is driven onto the grid electrode(s). The shielding signal may be a ground signal, such as the system ground or other ground, or any other constant voltage (i.e., non-modulated) signal. In another embodiment, operating the grid electrode(s) as a shield electrode may comprise electrically floating the grid electrode. In one embodiment, grid electrode(s) are able to operate as an effective shield electrode while being electrode floated due to its large coupling to the other sensor electrodes. In other embodiment, the shielding signal may be referred to as a "guarding signal" where the guarding signal is a varying voltage signal having at least one of a similar phase, frequency, and amplitude as the modulated signal driven on to the sensor electrodes. In one or more embodiment, routing traces may be shielded from responding to an input object due to routing beneath the grid electrode(s) and/or sensor electrodes 120, and therefore may not be part of the active sensor electrodes, shown as sensor electrodes 120.

In one or more embodiments, capacitive sensing (or input sensing) and display updating may occur during at least partially overlapping periods. For example, as a common electrode is driven for display updating, the common electrode may also be driven for capacitive sensing. In another embodiment, capacitive sensing and display updating may occur during non-overlapping periods, also referred to as non-display update periods. In various embodiments, the non-display update periods may occur between display line update periods for two display lines of a display frame and may be at least as long in time as the display update period. In such embodiments, the non-display update period may be referred to as a "long horizontal blanking period," "long h-blanking period" or a "distributed blanking period," where the blanking period occurs between two display updating periods and is at least as long as a display update period. In one embodiment, the non-display update period occurs between display line update periods of a frame and is long enough to allow for multiple transitions of the transmitter signal to be driven onto the sensor electrodes 120. In other embodiments, the non-display update period may comprise horizontal blanking periods and vertical blanking periods. Processing system 110 may be configured to drive sensor electrodes 120 for capacitive sensing during any one or more of or any combination of the different non-display update times. Synchronization signals may be shared between sensor module 310 and display driver module 320 to provide accurate control of overlapping display updating and capacitive sensing periods with repeatably coherent frequencies and phases. In one embodiment, these synchronization signals may be configured to allow the relatively stable voltages at the beginning and end of the input sensing period to coincide with display update periods with relatively stable voltages (e.g., near the end of a input integrator reset time and near the end of a display charge share time). A modulation frequency of a modulated or transmitter signal may be at a harmonic of the display line update rate, where the phase is determined to provide a nearly constant charge coupling from the display elements to the receiver electrode, allowing this coupling to be part of the baseline image.

The sensor module 310 includes circuitry configured to receive resulting signals with the sensor electrodes 120 and/or grid electrode(s) comprising effects corresponding to the modulated signals or the transmitter signals during periods in which input sensing is desired. The sensor module 310 may determine a position of the input object in the sensing region 170 or may provide a signal including information indicative of the resulting signal to another module or processor, for example, a determination module 330 or a processor of an associated electronic device 150 (i.e., a host processor), for determining the position of the input object in the sensing region 170.

The display driver module 320 may be included in or separate from the processing system 110. The display driver module 320 includes circuitry configured to provide display image update information to the display of the display device 160 during non-sensing (e.g., display updating) periods.

In one embodiment, the processing system 110 comprises a first integrated controller comprising the display driver module 320 and at least a portion of the sensor module 310 (i.e., transmitter module and/or receiver module). In another embodiment, the processing system 110 comprises a first integrated controller comprising the display driver module 320 and a second integrated controller comprising the sensor module 310. In yet another embodiment, the processing system comprises a first integrated controller comprising display driver module 320 and a first portion of the sensor module 310 (e.g., one of a transmitter module and a receiver module) and a second integrated controller comprising a second portion of the sensor module 310 (e.g., the other one of the transmitter and receiver modules). In those embodiments comprising multiple integrated circuits, a synchronization mechanism may be coupled between them, configured to synchronize display updating periods, sensing periods, transmitter signals, display update signals, and the like.

As mentioned above, in some embodiments a determination module 330 may be configured to determine a position of the input object in the sensing region 170. The determination module 330 may be further configured to perform other functions related to coordinating the operation of various components of the processing system 110. In an alternate embodiment, some or all of the functionality attributed to the determination module 330 may be provided by a processor external to the processing system 110 (e.g., a host processor of an associated electronic system).

Exemplary Arrangements for Input Device Receiver with Delta-Sigma Modulator

Figure 4:
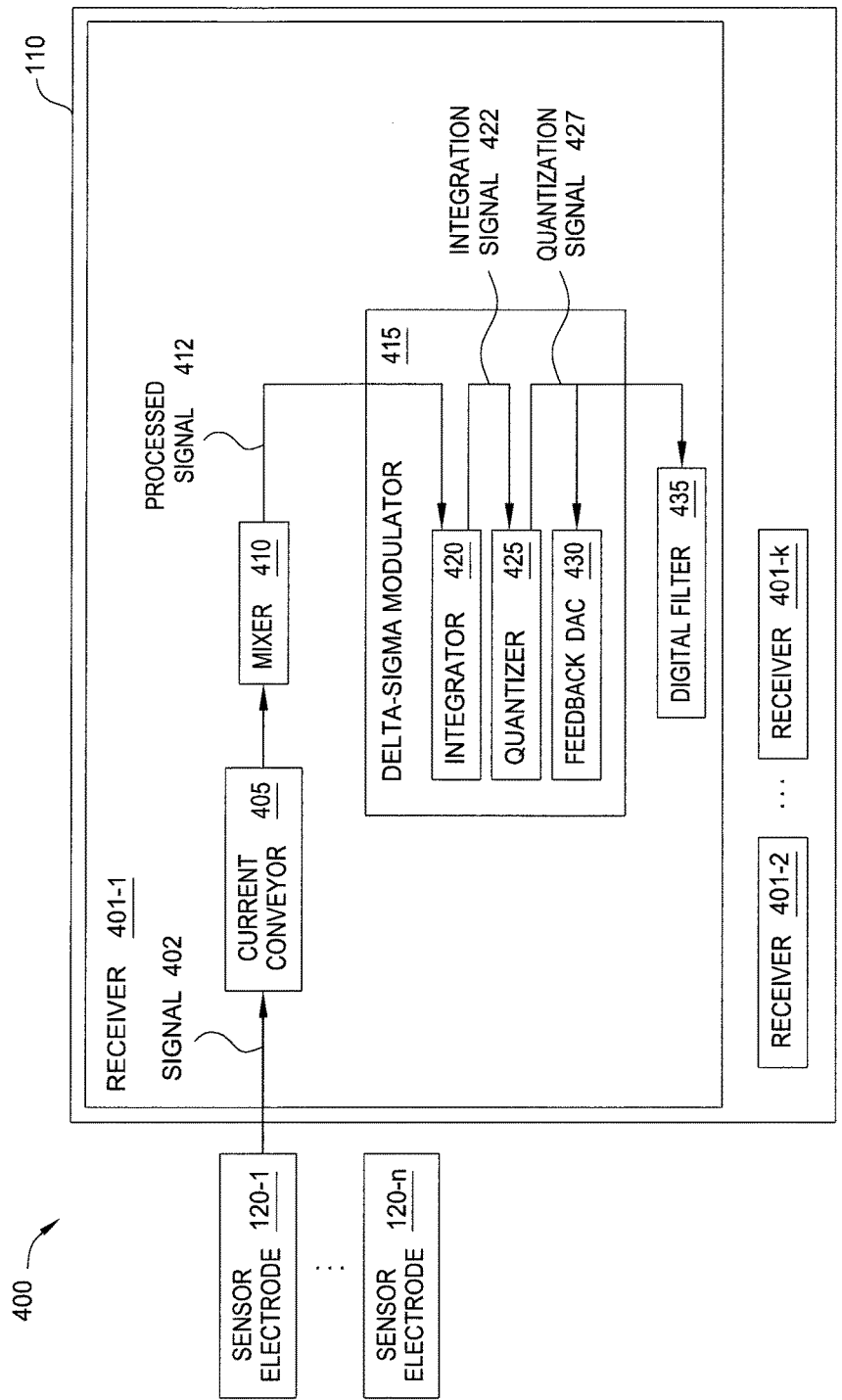
FIG. 4 illustrates a block diagram of an exemplary input device, according to one embodiment.

FIG. 4 illustrates a block diagram of an exemplary input device, according to one embodiment. More specifically, input device 400 comprises a processing system 110 coupled with a plurality of sensor electrodes 120-1 to 120-$n$. Although described using different reference numbers, it will be noted that input device 400 may include various features of the input device 100 discussed above.

The processing system 110 comprises a plurality of k receivers 401-1 to 401-$k$, each of which is configured to receive signals from the sensor electrodes 120-1 to 120-$n$. As shown, the receiver 401-1 is configured to receive a signal 402 from the sensor electrode 120-1. In some embodiments, the receivers 401-1 to 401-$k$ are provided as AFEs of the processing system 110, and may include further signal conditioning circuitry. While discussed specifically with respect to a plurality of sensor electrodes 120-1 to 120-$n$, the techniques discussed herein may also be used with other arrangements of sensor electrodes (e.g., the pluralities of sensor electrodes 205, 215 of FIG. 2). Furthermore, the receivers 401-1 to 401-$k$ may be used to receive signals within absolute capacitive and transcapacitive sensing implementations.

The receiver 401-1 comprises a current conveyor 405 and a mixer 410. The current conveyor 405 is configured to receive signal 402 and to mirror a current of the signal 402 to the output of the current conveyor 405. The current conveyor 405 may have any suitable gain value. The mixer 410 receives the mirrored current from the current conveyor 405 and downconverts the current from RF frequencies to approximately direct current (DC) levels (i.e., having substantially no frequency component). The mixer 410 may have any suitable implementation, such as a square-wave mixer, harmonic rejection mixer, or sinusoidal mixer.

The current conveyor 405 and mixer 410 operate to produce a processed signal 412 based on the received signal 402. The processed signal 412 may be in the form of a fully-differential output, a pseudo-differential output, or a single-ended output. In one embodiment, the sensor electrode 120-1 provides a single-ended signal 402 to the current conveyor 405 and the mixer 410 outputs a fully-differential processed signal 412.

The receiver 401-1 further comprises a delta-sigma modulator 415 and a digital filter 435. Generally, the delta-sigma modulator 415 operates to encode the processed signal 412 using relatively high-frequency delta-sigma modulation, and the digital filter 435 is applied to form a higher resolution, but lower sample frequency, digital output. The digital filter 435 may have any suitable implementation. For example, the digital filter 435 may be a finite impulse response (FIR) filter or an infinite impulse response (IIR) filter. In some embodiments, the digital filter 435 is a low-pass filter. In other embodiments, the digital filter 435 is a high-pass filter.

Further, in some embodiments having single-bit quantization, the digital filter 435 does not require decimation to be performed, as the single-bit stream can be used to analyze the frequency spectrum, e.g., using a windowed Fourier transform. Beneficially, omitting circuitry for performing decimation reduces the area required for the receiver 401-1.

In some embodiments, the delta-sigma modulator 415 is a differential input, first-order, continuous time, passive delta-sigma modulator with common-mode feedback. Beneficially, the first-order and continuous time aspects of the delta-sigma modulator 415 require relatively less circuitry than higher-order and/or discrete time implementations. For example, a continuous time implementation does not require sampling circuitry to be included outside of the loop of the delta-sigma modulator 415, resulting in an inherently anti-aliasing implementation. However, in alternate embodiments, the delta-sigma modulator 415 comprises a discrete time modulator and/or a higher order than first-order. Further, in alternate embodiments, the delta-sigma modulator 415 may have single-ended or pseudo-differential inputs.

The delta-sigma modulator 415 further comprises an integrator 420 configured to integrate the processed signal 412 to produce an integration signal 422. The integrator 420 may have an active or passive implementation. Generally, a passive implementation comprises solely passive circuit elements, such as resistances, capacitances, and/or inductances. Generally, an active implementation comprises an operational amplifier (op-amp) or other active devices capable of controlling electron flow based on a control signal. In some embodiments, integrator 420 comprises a passive integrator, which tends to require less area while providing improved linear performance, when compared with an active integrator.

The delta-sigma modulator 415 further comprises a quantizer 425 configured to generate a quantization signal 427 based on the integration signal 422. The quantizer 425 may have any suitable single-bit or multiple-bit implementation. In some embodiments, quantizer 425 is a single-bit quantizer that generally requires less area than a multiple-bit quantizer. The delta-sigma modulator 415 further comprises a feedback digital-to-analog-converter (DAC) 430 that is controlled based on the quantization signal 427. The feedback DAC 430 may have any suitable implementation, such as a return-to-zero (RZ) or a non-return-to-zero (NRZ) DAC. Furthermore, the feedback DAC 430 may be formed as a resistive implementation or a switched capacitor resistor (SCR) network implementation.

In some embodiments having a current conveyor 405, the delta-sigma modulator 415 comprises a common-mode feedback arrangement configured to mitigate common-mode currents produced by the current conveyor 405. However, in some alternate embodiments, the receiver 401-1 does not include the current conveyor 405 and mixer 410. Omitting the current conveyor 405 (and, in some cases, an associated common-mode feedback arrangement) and the mixer 410 requires less area for the receiver 401-1. In one non-limiting example, a fingerprint sensing implementation may omit the current conveyor 405 while retaining the common-mode feedback arrangement. Moreover, in these embodiments, the capacitance of the sensor electrode 120-1 can be used as the integrator 420, which can further reduce required area and power consumption of the receiver 401-1. Generally, using the capacitance of sensor electrode 120-1 for the integrator 420 tends to reduce the oversampling ratio of the delta-sigma modulator 415 for the same sampling frequency. In some cases, the performance of the delta-sigma modulator 415 is still acceptable, despite the reduced oversampling ratio. In one embodiment, the delta-sigma modulator 415 is increased to a second-order (or higher order) implementation to mitigate the decreased performance resulting from the reduced oversampling ratio.

In some embodiments, the receiver 401-1 is suitable for performing fingerprint sensing. Generally, fingerprint sensing is performed using differential sensor measurements in order to improve performance with respect to interference, while location sensing is typically performed using single-ended measurements. In these embodiments, the relatively low-impedance input stage comprising current conveyor 405 may be replaced with a high-impedance input stage (e.g., a transconductor). For example, the transconductor may be formed using a differential pair configured to receive the signal 402, a gain stage configured to amplify the output voltage of the differential pair, and a transconductance amplifier to convert the amplified output voltage to a current, which is then passed to the mixer 410.

Figure 5:
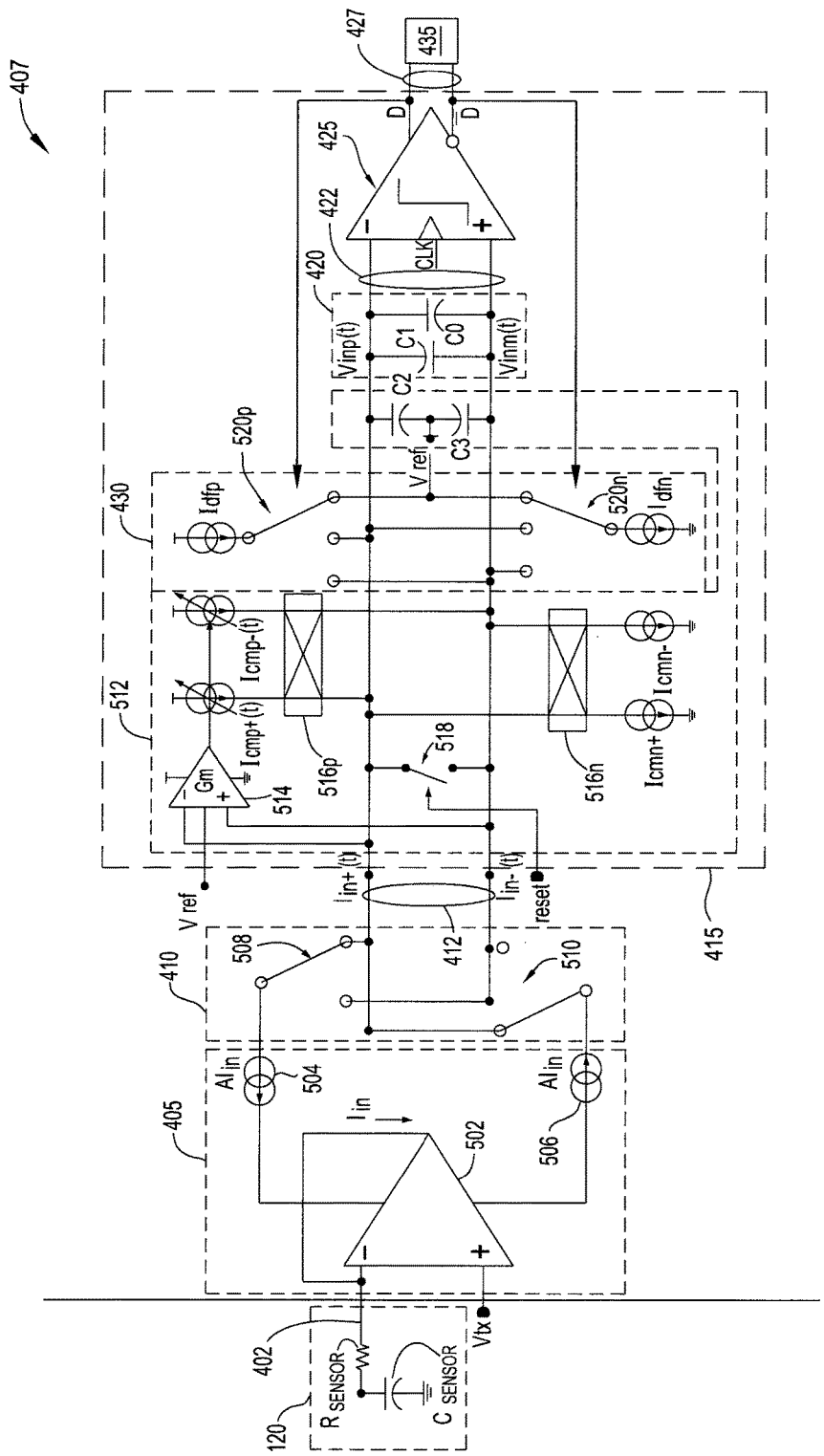
FIG. 5 illustrates a schematic block diagram of an exemplary input device, according to one embodiment.

FIG. 5 illustrates a schematic block diagram of an exemplary input device, according to one embodiment. More specifically, the arrangement 500 illustrates one possible implementation of a receiver 401 of the input device. It will be noted that elements may be added to and/or omitted from the arrangement 500 based on various features of the input devices 100, 400 discussed above.

A sensor electrode 120 is coupled with the receiver 401. The sensor electrode 120 is represented using a single-pole model comprising a resistance $R_{sensor}$ and capacitance $C_{sensor}$. While the sensor electrode 120 can exhibit more complex behavior in practice, a single-pole model provides a reasonably good approximation for purposes of this description. The sensor electrode 120 provides a signal 402 into an inverting terminal of an amplifier 502 having unity gain. The amplifier 502 is included as part of the current conveyor 405, which further comprises current mirrors 504, 506 that are configured to produce a scaled copy of the input current $I_{in}$ of the amplifier 502. The input current $I_{in}$ is generally produced through application of the reference voltage $V_{tx}$ to the non-inverting terminal of the amplifier 502, which in turn controls the voltage at the inverting terminal to apply the voltage across the sensor electrode 120. The input current $I_{in}$ generally includes the capacitive effects of an input device relative to the sensor electrode 120. The current mirrors 504, 506 each scale the input current $I_{in}$ by a factor A, and the scaled currents ($A \cdot I_{in}$) are provided to mixer 410.

Mixer 410 comprises switches 508, 510 operable to downconvert the scaled currents from radio frequency (RF) frequencies to approximately direct current (DC) values. In one embodiment, the mixer 410 effectively performs a polarity-switching function responsive to control signals provided to the switches 508, 510. The mixer 410 is configured to provide the processed signal 412 to fully-differential input nodes of the delta-sigma modulator 415. Generally, the processed signal 412 comprises continuous time output signals $I_{in+}(t)$, $I_{in-}(t)$ respectively provided to positive and negative input nodes of the delta-sigma modulator 415.

As shown, the delta-sigma modulator 415 includes a common-mode feedback arrangement 512 configured to mitigate a common-mode current produced by the current conveyor 405. Generally, the common-mode feedback arrangement 512 operates to keep the voltages on the input nodes $V_{inp}(t)$, $V_{inm}(t)$ centered around a common-mode voltage $V_{CM}$. The common-mode feedback arrangement 512 comprises a transconductance amplifier 514 having a gain $G_m$ and coupled with the positive and negative input nodes of the delta-sigma modulator 415. In some embodiments, the transconductance amplifier 514 is a class A amplifier or a class AB amplifier. The transconductance amplifier 514 is further configured to receive a reference voltage $V_{ref}$. In some embodiments, $V_{ref}$ is the common-mode voltage $V_{CM}$ or is approximately $V_{DD}/2$. The output of the transconductance amplifier 514 controls the current provided by current mirrors $I_{cmp+}(t)$, $I_{cmp-}(t)$ to the respective positive and negative input nodes. The common-mode feedback arrangement 512 further comprises current mirrors $I_{cmn+}(t)$, $I_{cmn-}(t)$ coupled with the respective positive and negative input nodes.

In some embodiments, the common-mode feedback arrangement 512 further comprises chopping circuitry 516p, 516n configured to mitigate a low-frequency noise of the current mirrors $I_{cmp+}(t)$, $I_{cmp-}(t)$, $I_{cmn+}(t)$, $I_{cmn-}(t)$. For example, the chopping circuitry 516p, 516n may be configured to remove a (1/f) noise of the current mirrors, while higher frequency noise is typically removed at a later stage by the digital filter 435. In some alternate embodiments, the common-mode feedback arrangement 512 is omitted.

The common-mode feedback arrangement 512 further comprises capacitances C2, C3 which are configured to prevent voltages on the input nodes $V_{inp}(t)$, $V_{inm}(t)$ from reaching rail voltages. The capacitances C2, C3 present a common-mode impedance that is seen by the currents output from the mixer 410 (as shown, $I_{in+}(t)$, $I_{in-}(t)$). Further, the capacitances C2, C3 enable function of the receiver 401 in that the output of the current conveyor 405 is only connected to one of the two input nodes of the delta-sigma modulator 415 at a given time.

The delta-sigma modulator 415 further comprises the integrator 420 coupled with the positive and negative input nodes. As shown, the integrator 420 is a passive integrator comprising capacitors C0, C1 and configured to produce an integration signal 422 based on the continuous time signals $I_{in+}$, $I_{in-}(t)$ on the positive and negative input nodes of the delta-sigma modulator 415. The reset switch 518 is configured to reset the delta-sigma modulator 415 to ensure that the delta-sigma modulator 415 begins sensing periods from a same bias point. The integrator 420 is coupled with input terminals of a single-bit quantizer 425. The quantizer 425 receives a clock signal (CLK) having a frequency suitable for achieving a relatively large oversampling ratio. Some non-limiting examples of "large" oversampling ratios are 500-2,000 or more. The oversampling ratio, when sufficiently large, causes quantization noise from the quantizer 425 to be shaped such that it is removed using the digital filter 435 (e.g., a low-pass digital filter).

The output value D of the quantizer 425 (and its inverse) represent a quantization signal 427 that is used to control switches 520p, 520n of a feedback digital-to-analog converter (DAC) 430 of the delta-sigma modulator 415. In this way, the integrator 420, quantizer 425, and feedback DAC 430 form a feedback loop of the delta-sigma modulator 415. The feedback DAC 430 further comprises current sources $I_{dfp}$, $I_{dfn}$ that are selectively coupled with the positive or negative input nodes of the delta-sigma modulator 415 based on the quantization signal 427. For example, when the voltage signal comprising the difference of $V_{inp}(t)$, $V_{inm}(t)$ increases (or expands), the quantization signal 427 causes current source $I_{dfp}$ to be connected with the negative input node, and causes current source $I_{din}$ to be coupled with the positive input node. In this way, current source $I_{dfp}$ pushes charge onto the top plate of capacitor C1, increasing the voltage $V_{inm}(t)$. Likewise, current source $I_{dfn}$ pulls charge from the top plate of capacitor C0, decreasing the voltage $V_{inp}(t)$ and thus mitigating the voltage difference between $V_{inp}(t)$ and $V_{inm}(t)$. The feedback DAC 430 further includes a "reset" state in which the current sources $I_{dfp}$, $I_{dfn}$ are coupled with the reference voltage $V_{ref}$.

In one embodiment, the current sources $I_{dfp}$, $I_{dfn}$ produce a return-to-zero (RZ) waveform having a 25% duty cycle, which may be advantageous for reducing intersymbol interference. In alternate embodiments, the current sources $I_{dfp}$, $I_{dfn}$ may provide RZ waveforms with different duty cycles or non-return-to-zero (NRZ) waveforms. Further, although the feedback DAC 430 may have alternate implementations such as a resistive implementation or a SCR network implementation, the depicted implementation of the current sources $I_{dfp}$, $I_{dfn}$ generally requires reduced area when compared with the alternate implementations.

Using the various techniques discussed above, the receiver 401 can provide substantial area savings for an input device, when compared with conventional receiver circuitry. For example, an area required for implementing an AFE including receiver 401 may be on the order of one-quarter (25%) the area required for a conventional touch-sensing AFE, or on the order of one-eighth (12.5%) the area required for a conventional fingerprint-sensing AFE. Therefore, more AFEs may be included within a given semiconductor area (and cost) to improve input sensing performance. Alternatively, a given number of AFEs requires less semiconductor area (and reduces cost) relative to conventional implementations.

The receiver 401 also provides improved sensing performance of the input device. Assuming a limited period is available for acquiring a sensing frame, the receiver 401 offers narrower system bandwidth and improves interference performance, as more receivers 401 can be included within a given semiconductor area and operated in parallel. For example, assume an input device includes 512 sensor electrodes and 64 "conventional" AFEs. If a period of 2 milliseconds (ms) is allotted equally for acquiring a sensing frame, each AFE corresponds to a maximum of 250 microseconds (μs)(2 ms×64/512) available for sensing. However, further assuming that receiver 401 provides a 4:1 area savings, the 64 "conventional" AFEs may be replaced by 256 AFEs, which corresponds to a maximum of 1 ms (2 ms×4×64/512) available for sensing. This 4:1 increase in sensing time can correspond to a 4:1 reduction in system bandwidth, which results in improved interference performance.

Further, AFEs implementing receiver 410 can reduce the total time required to acquire a sensing frame, which allows more time for display updating (e.g., enabling increased display resolutions) and/or other processing functions. For example, assuming the same sensing parameters from the previous example and maintaining the sensing time at 250 μs, then the total amount of time required for acquiring a sensing frame is 500 μs. Thus, 1.5 ms of the 2 ms allotted for sensing may be returned to the display, which may reduce constraints on display timing and signal settling.

Figure 6:
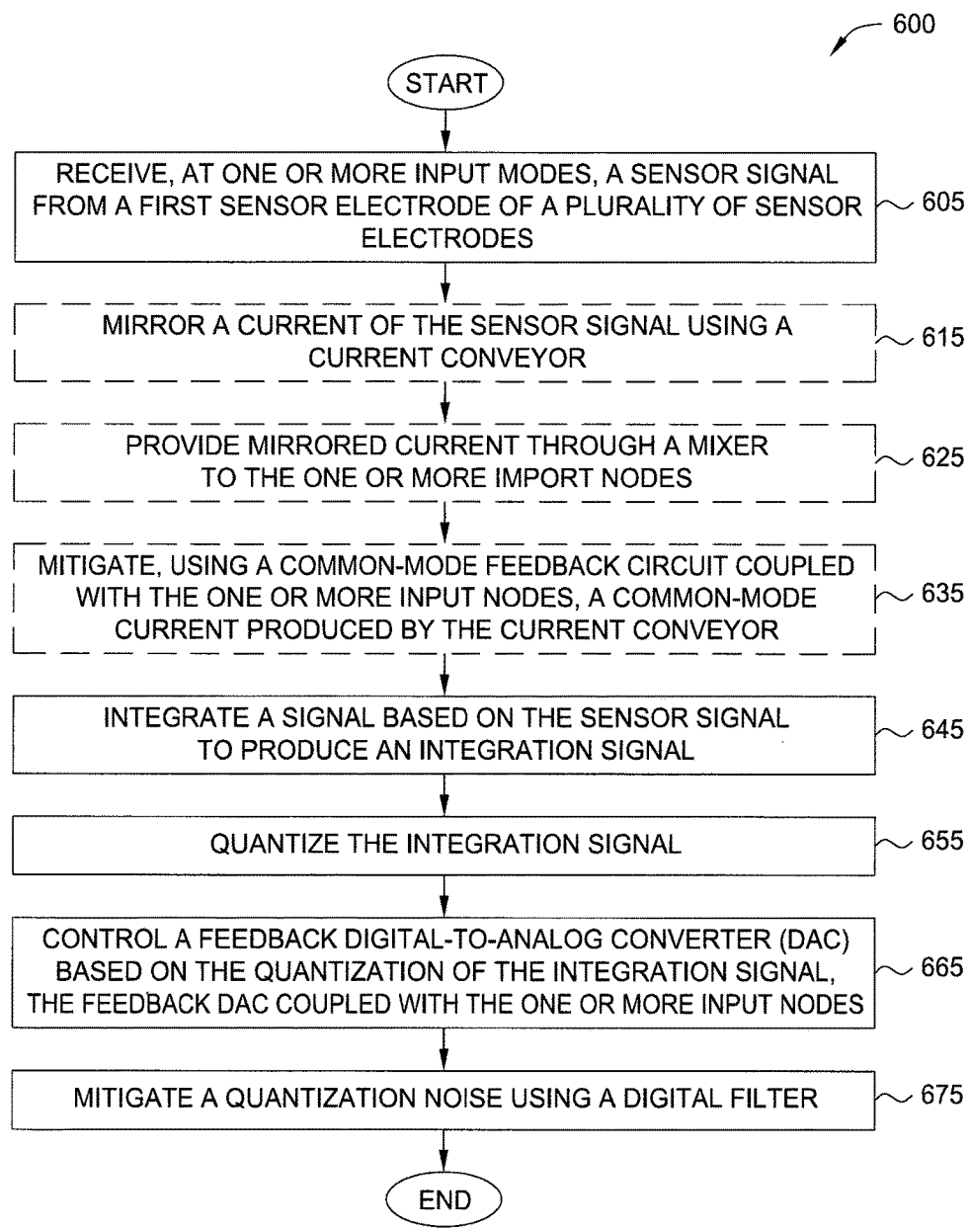
FIG. 6 is an exemplary method of processing signals received from a sensor electrode, according to one embodiment.

FIG. 6 is an exemplary method of processing signals received from a sensor electrode, according to one embodiment. Method 600 is generally intended to be performed in conjunction with embodiments of receiver 401, discussed above with respect to FIG. 4.

Method 600 begins at block 605, where a sensor signal is received at one or more input nodes from a first sensor electrode of a plurality of sensor electrodes. In some embodiments, the one or more input nodes are input nodes of a delta-sigma modulator of the receiver 401. In other embodiments, the one or more input nodes are inputs nodes of a current conveyor coupled with the delta-sigma modulator through a mixer. In this case, the sensor signal may be a single-ended input to the current conveyor.

For embodiments including a current conveyor and mixer, at optional block 615, a current of the sensor signal is mirrored using a current conveyor. In some embodiments, the mirrored current is also scaled based on a gain of current mirrors included in the current conveyor. At optional block 625, the mirrored current is provided through a mixer to one or more input nodes of the delta-sigma modulator. At optional block 635, using a common-mode feedback circuit coupled with the one or more input nodes, a common-mode current produced by the current conveyor is mitigated.

At block 645, a signal based on the sensor signal is integrated to produce an integration signal. At block 655, the integration signal is quantized. At block 665, a feedback digital-to-analog converter (DAC) coupled with the one or more input nodes is controlled based on the quantization of the integration signal. At block 675, a quantization noise is mitigated using a digital filter coupled with the delta-sigma modulator. Method 600 ends following completion of block 675.

Thus, the embodiments and examples set forth herein were presented in order to best explain the embodiments in accordance with the present technology and its particular application and to thereby enable those skilled in the art to make and use the disclosure. However, those skilled in the art will recognize that the foregoing description and examples have been presented for the purposes of illustration and example only. The description as set forth is not intended to be exhaustive or to limit the disclosure to the precise form disclosed.

In view of the foregoing, the scope of the present disclosure is determined by the claims that follow.

What is claimed is:

1. A processing system for an input device comprising a plurality of sensor electrodes, the processing system comprising:
    a current conveyor configured to receive a sensor signal from a first sensor electrode of the plurality of sensor electrodes, and to output a mirrored current of the sensor signal;
    a mixer configured to downconvert the mirrored current, and to output a processed sensor signal;
    a delta-sigma modulator comprising:
        one or more input nodes configured to receive the processed sensor signal;
        an integrator coupled with the one or more input nodes and configured to produce an integration signal;
        a quantizer coupled with an output of the integrator and configured to quantize the integration signal; and
        a feedback digital-to-analog converter (DAC) controlled based by the quantizer; and
    a digital filter coupled with an output of the delta-sigma modulator and configured to mitigate a quantization noise of the quantizer.

2. The processing system of claim 1, wherein the delta-sigma modulator further comprises:
    a common-mode feedback circuit coupled with the one or more input nodes and configured to mitigate a common-mode current produced by the current conveyor.

3. The processing system of claim 1, wherein the current conveyor comprises a single-ended input and the delta-sigma modulator comprises fully-differential inputs.

4. The processing system of claim 1, wherein the delta-sigma modulator is a continuous-time modulator, wherein the digital filter is a low-pass filter, and wherein the quantizer is a single-bit quantizer.

5. The processing system of claim 1, wherein the integrator is a passive integrator.

6. The processing system of claim 5, wherein the passive integrator comprises a capacitance of the first sensor electrode.

7. An input device, comprising:
a plurality of sensor electrodes; and
a processing system coupled with the plurality of sensor electrodes and comprising:
 a current conveyor configured to receive a sensor signal from a first sensor electrode of the plurality of sensor electrodes, and to output a mirrored current of the sensor signal;
 a mixer configured to downconvert the mirrored current, and to output a processed sensor signal;
 a delta-sigma modulator comprising:
  one or more input nodes configured to receive the processed signal;
  an integrator coupled with the one or more input nodes and configured to produce an integration signal;
  a quantizer coupled with an output of the integrator and configured to quantize the integration signal; and
  a feedback digital-to-analog converter (DAC) controlled based by the quantizer; and
 a digital filter coupled with an output of the delta-sigma modulator and configured to mitigate a quantization noise of the quantizer.

8. The input device of claim 7, wherein the delta-sigma modulator further comprises:
a common-mode feedback circuit coupled with the one or more input nodes and configured to mitigate a common-mode current produced by the current conveyor.

9. The input device of claim 7, wherein the current conveyor comprises a single-ended input and the delta-sigma modulator comprises fully-differential inputs.

10. The input device of claim 7, wherein the delta-sigma modulator is a continuous-time modulator, wherein the digital filter is a low-pass filter, and wherein the quantizer is a single-bit quantizer.

11. The input device of claim 7, wherein the integrator is a passive integrator.

12. The input device of claim 11, wherein the passive integrator comprises a capacitance of the first sensor electrode.

13. A method comprising:
mirroring, using a current conveyor, a current of a sensor signal received from a first sensor electrode of a plurality of sensor electrodes;
downconverting, using a mixer, the mirrored current to produce a processed sensor signal;
integrating a signal based on the processed sensor signal to produce an integration signal;
quantizing the integration signal;
controlling a feedback digital-to-analog converter (DAC) based on the quantization of the integration signal, the feedback DAC coupled with one or more input nodes; and
mitigating a quantization noise using a digital filter.

14. The method of claim 13, further comprising:
mitigating, using a common-mode feedback circuit coupled with the one or more input nodes, a common-mode current produced by the current conveyor.

15. The method of claim 13, wherein the current conveyor comprises a single-ended input and a delta-sigma modulator comprises fully-differential inputs.

16. The method of claim 13, wherein receiving the sensor signal, integrating the signal, quantizing the integration signal, and controlling the feedback DAC are performed by a delta-sigma modulator, wherein the delta-sigma modulator is a continuous-time modulator, wherein the digital filter is a low-pass filter, and wherein the quantizer is a single-bit quantizer.

17. The method of claim 13, wherein integrating the signal is performed using a passive integrator.

18. The processing system of claim 1, wherein the mirrored current output by the current conveyor is scaled by a non-unity value of a factor A.

19. The processing system of claim 1, wherein the mixer is configured to downconvert the mirrored current to approximately direct current (DC) levels.

20. The processing system of claim 1, wherein the mixer comprises one of a square-wave mixer, a harmonic rejection mixer, and a sinusoidal mixer.

* * * * *

UNITED STATES PATENT AND TRADEMARK OFFICE
CERTIFICATE OF CORRECTION

PATENT NO. : 10,061,415 B2
APPLICATION NO. : 15/199276
DATED : August 28, 2018
INVENTOR(S) : Eric Scott Bohannon, Marshall J. Bell, Jr. and Yihong Yang Page 1 of 1

It is certified that error appears in the above-identified patent and that said Letters Patent is hereby corrected as shown below:

In the Specification

On Column 17, Line 37, delete "$l_{in}$" and insert -- $I_{in}$ --, therefor.

On Column 18, Line 35, delete "$I_{in+}$," and insert -- $I_{in+}(t)$, --, therefor.

On Column 18, Line 61, delete "$I_{din}$" and insert -- $I_{dfn}$ --, therefor.

On Column 18, Line 64, delete "$I_{dfm}$" and insert -- $I_{dfn}$ --, therefor.

Signed and Sealed this
Eleventh Day of June, 2019

Andrei Iancu
*Director of the United States Patent and Trademark Office*